(12) United States Patent
Kolev et al.

(10) Patent No.: US 11,133,272 B1
(45) Date of Patent: Sep. 28, 2021

(54) VERTICALLY-ALIGNED AND CONDUCTIVE DUMMIES IN INTEGRATED CIRCUIT LAYERS FOR CAPACITANCE REDUCTION AND BIAS INDEPENDENCE AND METHODS OF MANUFACTURE

(71) Applicant: QUALCOMM Incorporated, San Diego, CA (US)

(72) Inventors: Plamen Vassilev Kolev, San Diego, CA (US); Anil Kumar Vemulapalli, Milpitas, CA (US); Matthew Deig, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/856,805

(22) Filed: Apr. 23, 2020

(51) Int. Cl.
| | |
|---|---|
| H01L 23/64 | (2006.01) |
| H01L 21/84 | (2006.01) |
| H01L 23/00 | (2006.01) |
| H01L 27/12 | (2006.01) |
| H01L 29/66 | (2006.01) |

(52) U.S. Cl.
CPC ............ *H01L 23/642* (2013.01); *H01L 21/84* (2013.01); *H01L 23/562* (2013.01); *H01L 27/1203* (2013.01); *H01L 27/12* (2013.01); *H01L 29/6659* (2013.01)

(58) Field of Classification Search
CPC ..... H01L 23/642; H01L 21/84; H01L 23/562; H01L 27/1203; H01L 21/3085; H01L 29/66545
USPC .................. 257/347, 368; 438/149, 749, 517
See application file for complete search history.

(56) References Cited

U.S. PATENT DOCUMENTS

| | | | |
|---|---|---|---|
| 9,793,372 B1 * | 10/2017 | Smith et al. | ...... H01L 29/66545 |
| 2004/0089950 A1 | 5/2004 | Nanjo | |
| 2007/0221957 A1 | 9/2007 | Kitajima et al. | |
| 2011/0031536 A1 | 2/2011 | Okamoto et al. | |

OTHER PUBLICATIONS

Invitation to Pay Additional Fees and Partial International Search for International Patent Application No. PCT/US2021/024105, dated Jun. 17, 2021, 12 pages.

* cited by examiner

*Primary Examiner* — Thinh T Nguyen
(74) *Attorney, Agent, or Firm* — Withrow & Terranova, PLLC

(57) ABSTRACT

Vertically-aligned and conductive dummies in integrated circuit (IC) layers reduce capacitance and bias independence. Dummies are islands of material in areas of metal and semiconductor IC layers without circuit features to avoid non-uniform polishing ("dishing"). Conductive diffusion layer dummies in a diffusion layer and conductive polysilicon dummies in a polysilicon layer above the diffusion layer reduce bias dependence and nonlinear circuit operation in the presence of an applied varying voltage. ICs with metal dummies vertically aligned in at least one metal layer above the polysilicon dummies and diffusion dummies reduce lateral coupling capacitance compared to ICs in which dummies are dispersed in a non-overlapping layout by a foundry layout tool. Avoiding lateral resistance-capacitance (RC) ladder networks created by dispersed dummies improves signal delays and power consumption in radio-frequency (RF) ICs.

18 Claims, 10 Drawing Sheets

VERTICALLY-ALIGNED AND CONDUCTIVE DUMMIES IN INTEGRATED CIRCUIT LAYERS FOR CAPACITANCE REDUCTION AND BIAS INDEPENDENCE AND METHODS OF MANUFACTURE

BACKGROUND

I. Field of the Disclosure

The technology of the disclosure relates generally to integrated circuit (IC) fabrication and, more particularly, to IC parasitic coupling capacitance and linearity.

II. Background

Transistors in an integrated circuit (IC) chip are electrically coupled to each other and to external circuit contacts by metal wires or traces. The transistors are formed in semiconductor layers in a three-dimensional (3D) structure which also includes metal layers for forming the metal traces. As the 3D structure is formed layer by layer, portions of the transistors and metal traces are created as features of patterns in a series of photolithographic processes. Pattern features within each layer may be densely populated in some areas, depending on the IC design, such that there is a small distance between features, while other areas are only sparsely populated or devoid of such features. In these other areas, the distance between features is larger, and these distances create a problem known as "dishing" in a polishing process, such as chemical mechanical polishing (CMP), employed at each layer for thinning and/or planarizing. In areas in which features are densely populated, the effects of the polishing process are evenly distributed over all features, resulting in consistent feature thickness. However, at the edges of the densely-populated areas, where the distance between features increases, the effects of the polishing process are not evenly distributed, causing feature thickness to be inconsistent with (e.g., thinner than) other features in the layer.

To avoid dishing, dummy structures ("dummies") are added to the patterns in each layer of the semiconductor structure in the less populated areas. Dummies are inactive islands or isolated portions of a layer. Dummies are not coupled to a circuit and are provided only to reduce the distance between structural features and promote more consistent polishing results. IC foundry layout tools automatically add dummies to IC layers wherever a distance between features exceeds a threshold. Dummies are added in semiconductor layers (e.g., polysilicon and epitaxial diffusion layers) in addition to metal layers. In conventional silicon-on-insulator (SOI) ICs, dummies can increase parasitic capacitance by vertically coupling to a handle wafer above or below the semiconductor layers. Parasitic capacitance increases delay and power consumption in an IC.

SUMMARY OF THE DISCLOSURE

Aspects disclosed herein include vertically-aligned and conductive dummies in integrated circuit (IC) layers for capacitance reduction and bias independence. In other aspects, methods of manufacturing ICs including vertically-aligned and/or conductive dummies are disclosed. Dummies are isolated inactive islands or regions of material in the respective layers of ICs provided in areas that do not include circuit features to avoid non-uniform polishing ("dishing"). In one exemplary aspect, a disclosed IC includes a plurality of diffusion layer dummies of semiconductor material, and a plurality of polysilicon dummies in a polysilicon layer disposed above the diffusion layer. The diffusion dummies and the polysilicon dummies are treated with dopant and/or salicide to be highly conductive to reduce bias dependence, which causes nonlinear operation of an IC. In another exemplary aspect, an IC as disclosed includes a plurality of metal dummies in a metal layer disposed above the polysilicon layer. The layout of the IC includes metal dummies vertically aligned over respective polysilicon and diffusion dummies. Vertically-aligning dummies in these three (3) layers of an IC reduces lateral coupling capacitance compared to ICs in which dummies are dispersed in a non-overlapping layout by a foundry layout tool, as an example. It may be desired to avoid lateral resistance-capacitance (RC) ladder networks created by dispersed dummies in some ICs due to resulting increases in signal delays and power consumption. In addition, semiconductor dummies whose resistances and capacitances vary with an applied voltage can cause non-linear circuit operation in radio-frequency (RF) ICs.

In another disclosed exemplary aspect, a method of manufacturing ICs includes placing dummies in vertical alignment to reduce lateral parasitic coupling capacitance. In this method, the placement of dummies is controlled and customized to vertically align the dummies to prevent a foundry layout tool from dispersing the dummies in a non-overlapping layout that creates lateral parasitic coupling capacitance.

In another exemplary aspect, a method for manufacturing ICs includes treating semiconductor dummies to be highly conductive. The method includes doping the semiconductor dummies to have a high dopant (of a P-type or N-type) concentration, and/or applying a salicide to the surface of the semiconductor dummies to increase conductivity.

In this regard, in one aspect, an IC is disclosed. The IC includes a plurality of diffusion dummies in a diffusion layer, each diffusion dummy comprising semiconductor material extending in a horizontal plane. The IC also includes a plurality of polysilicon dummies in a polysilicon layer above the diffusion layer in a vertical direction orthogonal to the horizontal plane. The IC also includes a plurality of metal dummies in a metal layer above the polysilicon layer in the vertical direction. A first portion of a first metal dummy of the plurality of metal dummies is above a first portion of a first polysilicon dummy of the plurality of polysilicon dummies in the vertical direction. A first portion of a first diffusion dummy of the plurality of diffusion dummies is below the first portion of the first polysilicon dummy in the vertical direction.

In another aspect, an IC is disclosed. The IC includes a plurality of polysilicon dummies in a polysilicon layer, each polysilicon dummy comprising an island of polycrystalline silicon. The IC also includes a plurality of diffusion dummies in a horizontal plane in a diffusion layer, each diffusion dummy comprising a semiconductor island of semiconductor material. Each semiconductor island includes a perimeter region having a width, extending in the horizontal plane, around a central region of the semiconductor island. The central region includes a first resistivity. The perimeter region includes the semiconductor material including a second resistivity surrounding the central region.

In another aspect, a method of manufacturing an IC is disclosed. The method includes forming a diffusion layer comprising a plurality of diffusion dummies, each diffusion dummy comprising semiconductor material extending in a horizontal plane. The method also includes forming a polysilicon layer above the diffusion layer in a vertical direction orthogonal to the horizontal plane, the polysilicon layer comprising a plurality of polysilicon dummies, a portion of a first one of the plurality of polysilicon dummies above a portion of a first one of the plurality of diffusion dummies in the vertical direction. The method also includes forming a plurality of first metal dummies in a first metal layer above the polysilicon layer in the vertical direction, a portion of a first one of the plurality of first metal dummies above the portion of the first one of the plurality of polysilicon dummies in the vertical direction.

In another aspect, a method of manufacturing an IC is disclosed. The method includes forming a diffusion layer comprising a plurality of diffusion dummies. The method also includes forming a polysilicon layer comprising a plurality of polysilicon dummies. The method also includes treating the diffusion layer and the polysilicon layer to reduce resistivity of each of the plurality of diffusion dummies and each of the plurality of polysilicon dummies. The method also includes forming a metal layer comprising a plurality of metal dummies.

DETAILED DESCRIPTION

Figure 1A:
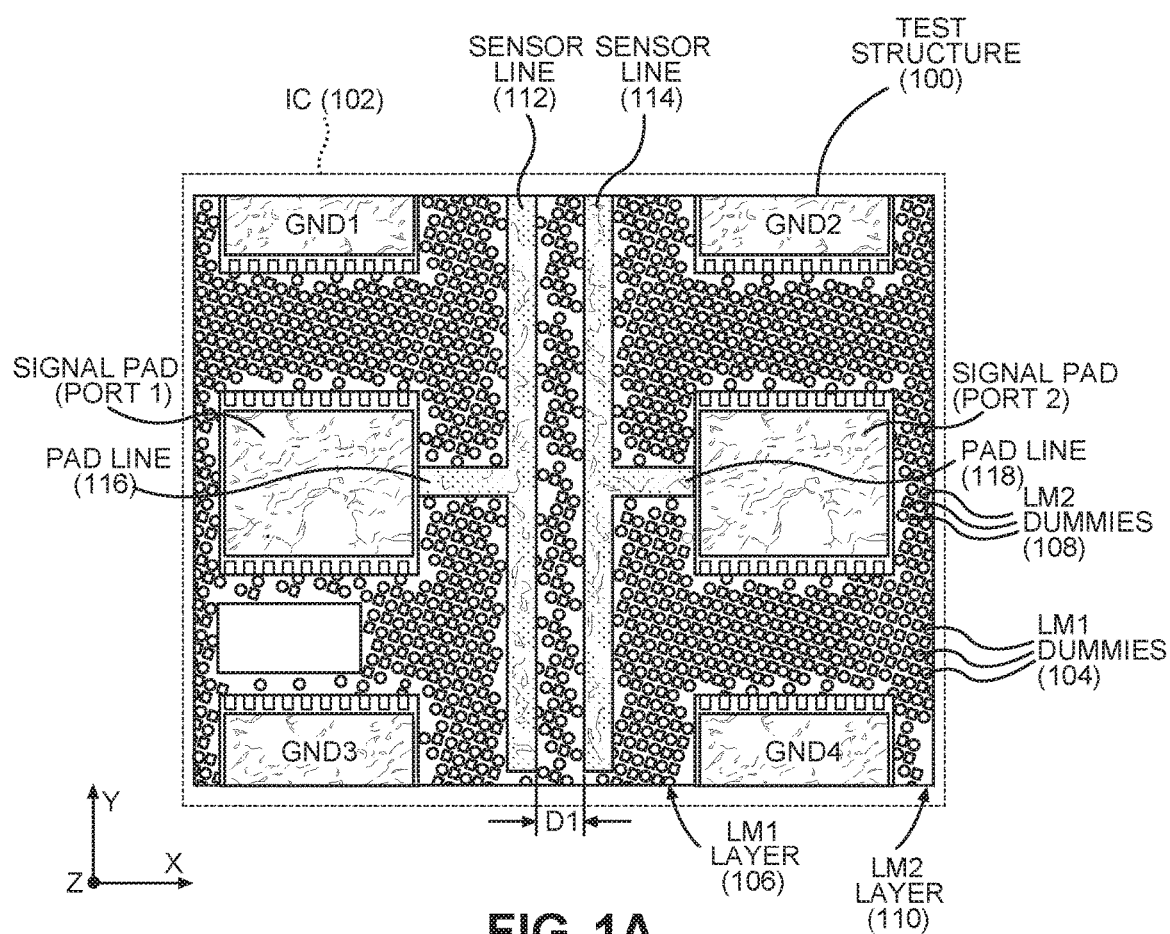
FIG. 1A is a schematic diagram of top view of a surface of a test structure of an integrated circuit (IC) illustrating lower metal 2 (LM2) dummies interspersed in a non-overlapping manner with lower metal 1 (LM1) dummies according to a foundry layout.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include vertically-aligned and conductive dummies in integrated circuit (IC) layers for capacitance reduction and bias independence. In other aspects, methods of manufacturing ICs including vertically-aligned and/or conductive dummies are disclosed. Dummies are isolated inactive islands or regions of material in the respective layers of ICs provided in areas that do not include circuit features to avoid non-uniform polishing ("dishing"). In one exemplary aspect, a disclosed IC includes a plurality of diffusion layer dummies of semiconductor material, and a plurality of polysilicon dummies in a polysilicon layer disposed above the diffusion layer. The diffusion dummies and the polysilicon dummies are treated with dopant and/or salicide to be highly conductive to reduce bias dependence, which causes nonlinear operation of an IC. In another exemplary aspect, an IC as disclosed includes a plurality of metal dummies in a metal layer disposed above the polysilicon layer. The layout of the IC includes metal dummies vertically aligned over respective polysilicon and diffusion dummies. Vertically-aligning dummies in these three (3) layers of an IC reduces lateral coupling capacitance compared to ICs in which dummies are dispersed in a non-overlapping layout by a foundry layout tool, as an example. It may be desired to avoid lateral resistance-capacitance (RC) ladder networks created by dispersed dummies in some ICs due to resulting increases in signal delays and power consumption. In addition, semiconductor dummies whose resistances and capacitances vary with an applied voltage can cause non-linear circuit operation in radio-frequency (RF) ICs.

In another disclosed exemplary aspect, a method of manufacturing ICs includes placing dummies in vertical alignment to reduce lateral parasitic coupling capacitance. In this method, the placement of dummies is controlled and customized to vertically align the dummies to prevent a foundry layout tool from dispersing the dummies in a non-overlapping layout that creates lateral parasitic coupling capacitance.

In another exemplary aspect, a method for manufacturing ICs includes treating semiconductor dummies to be highly conductive. The method includes doping the semiconductor dummies to have a high dopant (of a P-type or N-type) concentration, and/or applying a salicide to the surface of the semiconductor dummies to increase conductivity.

Before discussing vertically-aligned and conductive dummies implemented in an IC to reduce lateral parasitic coupling capacitance and bias dependence, starting at FIG. 2A, a test structure 100 including dummies dispersed in a non-overlapping manner in a foundry layout, and the lateral parasitic coupling capacitance and bias dependence occurring in such layout, are first discussed with reference to FIGS. 1A and 1B.

Dummies are added to an IC layout by foundry layout tools to avoid dishing, which is non-uniform thinning of features in a layer during polishing. These dummies are dispersed in a non-overlapping manner to avoid vertical parasitic coupling capacitance to a handle wafer or substrate attached on an upper or lower side of the IC. In this regard, FIG. 1A is a schematic diagram of a top view of an exemplary test structure 100 formed in an IC 102 in which lateral parasitic coupling capacitance and bias dependence are introduced by the foundry-placed non-overlapping dummies. The IC 102 including the test structure 100 is an example of a circuit in which active circuit elements, such as transistors formed in the semiconductor layers, are interconnected by metal traces in the metal layers. The top view of FIG. 1A shows lower metal 1 (LM1) dummies 104 in a LM1 layer 106 and lower metal 2 (LM2) dummies 108 in a LM2 layer 110. The LM2 dummies 108 are located in areas between features in the LM2 layer 110 to avoid non-uniform polishing. At the LM2 layer 110 shown in FIG. 1A, the features include sensor lines 112 and 114, signal pads Port 1 and Port 2, pad lines 116 and 118, and ground pads GND1-GND4. LM1 dummies 104 are also placed in areas having no features in the LM1 layer 106. Herein, non-overlapping LM1 and LM2 dummies indicates that the LM1 dummies 104 are not overlapped from above by the LM2 dummies 108. The LM2 dummies 108 and the LM1 dummies 104 are non-overlapping according to a layout generated by a foundry layout tool, which disperses dummies in a non-overlapping layout to avoid vertical parasitic coupling capacitance to a handle layer.

The test structure 100 in FIG. 1A can be used to measure parasitic coupling capacitance between the sensor lines 112 and 114 on the LM2 layer 110. The signal pads Port 1 and Port 2 and the pad lines 116 and 118 are connected to the sensor lines 112 and 114 on the LM2 layer 108. The sensor lines 110 and 112 are parallel to each other and separated by a distance D1, creating capacitance when a voltage is applied to signal pads Port 1 and Port 2.

The technology of the IC 102, and exemplary structures disclosed herein, includes a semi-insulating handle wafer (not shown here) having a highly-resistive surface that is one example of a handle wafer that virtually eliminates vertical capacitance to the dummies. However, parasitic coupling capacitance is still detected between the sensor lines 110 and 112 when a voltage is applied at the signal pads Port 1 and Port 2. Reducing parasitic coupling capacitance in an IC with electronic circuits reduces signal delay and power consumption in those circuits. In addition, bias dependencies are detected in the test structure 100 in the presence of a varying applied voltage. Reducing bias dependence improves linearity in the operation of the circuits, which is especially important in RF applications.

To better understand the source of the detected parasitic coupling capacitance, measurements of the test structure 100, including the non-overlapping LM1 dummies 104 and LM2 dummies 108, were compared to simulations of identical test structures from which the dummies were omitted. The simulated test structures, without any dummies, showed significantly less parasitic coupling capacitance than in the test structure 100, and further testing confirmed that the non-overlapping dummies in the test structure 100 are a source of the parasitic coupling capacitance, as explained with reference to FIG. 1B.

Figure 1B:
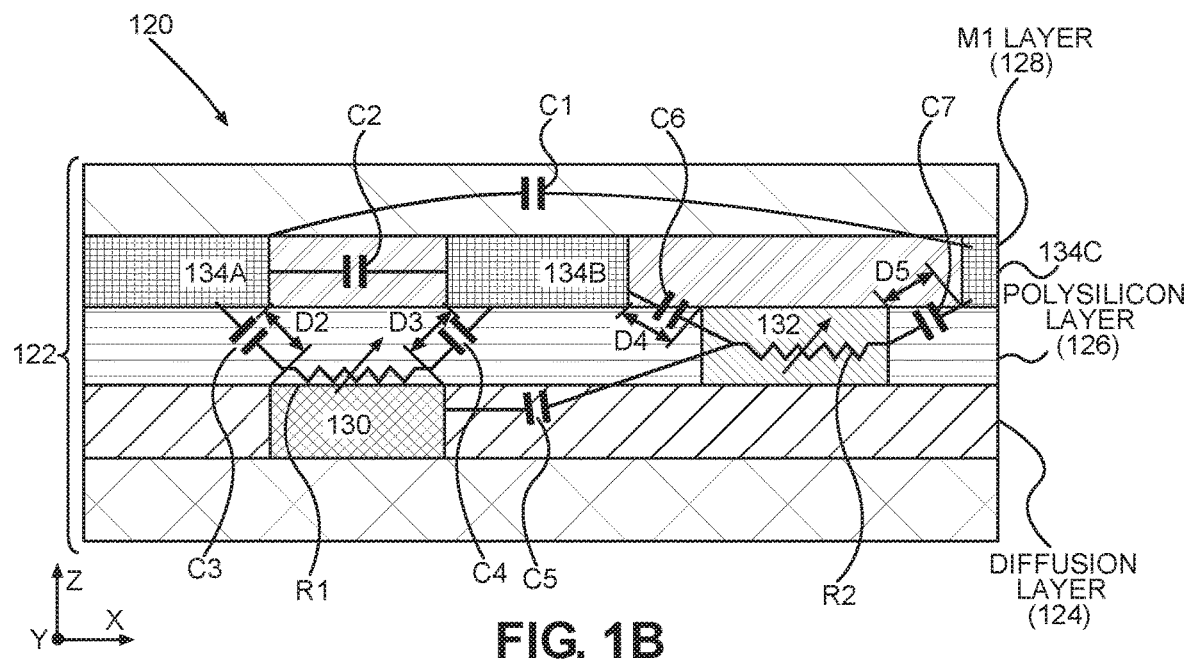
FIG. 1B is a cross-sectional side view of a semiconductor and metal layers of the IC in FIG. 1A, illustrating an example of non-overlapping dummies as placed by a foundry layout tool and annotated with indications of resistance and capacitance among the dummies creating a resistance-capacitance (RC) network.

FIG. 1B is cross-sectional side view illustrating capacitive coupling in a sub-region 120 of the IC 102 including a plurality of layers 122. The sub-region 120 includes a diffusion layer 124, a polysilicon layer 126, and an M1 layer 128 stacked in a vertical direction. The diffusion layer 124 in FIG. 1B includes a diffusion dummy 130, the polysilicon layer 126 includes a polysilicon dummy 132, and the M1 layer 128 includes M1 dummies 134A, 134B, and 134C. The diffusion dummy 130 in the diffusion layer 124 in this example is formed of lightly-doped silicon, which is also used to form channel regions of silicon-on-insulator (SOI) metal-oxide semiconductor (MOS) field-effect transistors (FETs) (SOI MOSFETs) (not shown) employed in active circuits. The polysilicon features in the polysilicon layer 126 are polycrystalline silicon features that can form gates of the SOI MOSFETs.

FIG. 1B is annotated to indicate a network of parasitic capacitances C1-C7 formed among the dummies 130, 132, and 134A-134C in close proximity in diagonal and horizontal directions. Resistances R1 and R2 indicate resistances in a horizontal direction through the diffusion dummy 130 and the polysilicon dummy 132, respectively, which each consist of a lightly-doped semiconductor material (e.g., silicon). A lateral RC network created, by capacitances such as C1-C7 and resistances such as R1 and R2, in an IC 102 significantly increase undesirable signal delays and power consumption in active circuits.

As shown, the dummies 130 and 132 in adjacent layers 124 and 126 are offset from each other in the horizontal direction according to a method of a foundry layout tool to avoid overlap that can cause vertical coupling capacitance to some handle wafers. Similarly, the dummies 134A-134C in the M1 layer 128 are positioned to not overlap with the dummy 130 in the polysilicon layer 126. As a result of such orientation, diagonal distances D2-D5 between the dummies 130, 132, and 134A-134C are small, which increases capacitances in a network in a lateral direction. In addition, a foundry layout tool places dummies that are within a same layer, such as dummies 134A-134C in the M1 layer 128, closer to each other than is necessary to avoid polishing non-uniformities (i.e., dishing). Smaller horizontal spacing between dummies within a layer increases unwanted capacitance in the foundry layout.

In addition to the diagonal capacitances between the dummies 130, 132, 134A-134C above, another problem detected in the sub-region 120 is bias dependence, which is caused by lightly-doped semiconductor dummies (i.e., the diffusion dummy 130 and the polysilicon dummy 132). Bias dependence causes active circuits to respond non-linearly in the presence of a varying applied voltage, such as in RF circuits. Semiconductor material having a low dopant concentration has a high resistivity that varies in the presence of a changing electric field, which changes according to a voltage signal applied to the test structure 100. The electric field also affects charge carriers within the lightly-doped polysilicon dummy 132 and the diffusion dummy 130, causing changes in the internal capacitances of the semiconductor dummies. These changes in resistance and capacitance are known as bias dependence, which causes non-linear responses in active circuits under a varying applied voltage. Foundry processes create semiconductor dummies that are lightly doped to avoid vertical capacitance, but this increases lateral bias dependence. The lateral capacitances C1-C7 and the varying resistances R1 and R2 together form a bias dependent lateral RC ladder network that can degrade performance in RF ICs.

Figure 2A:
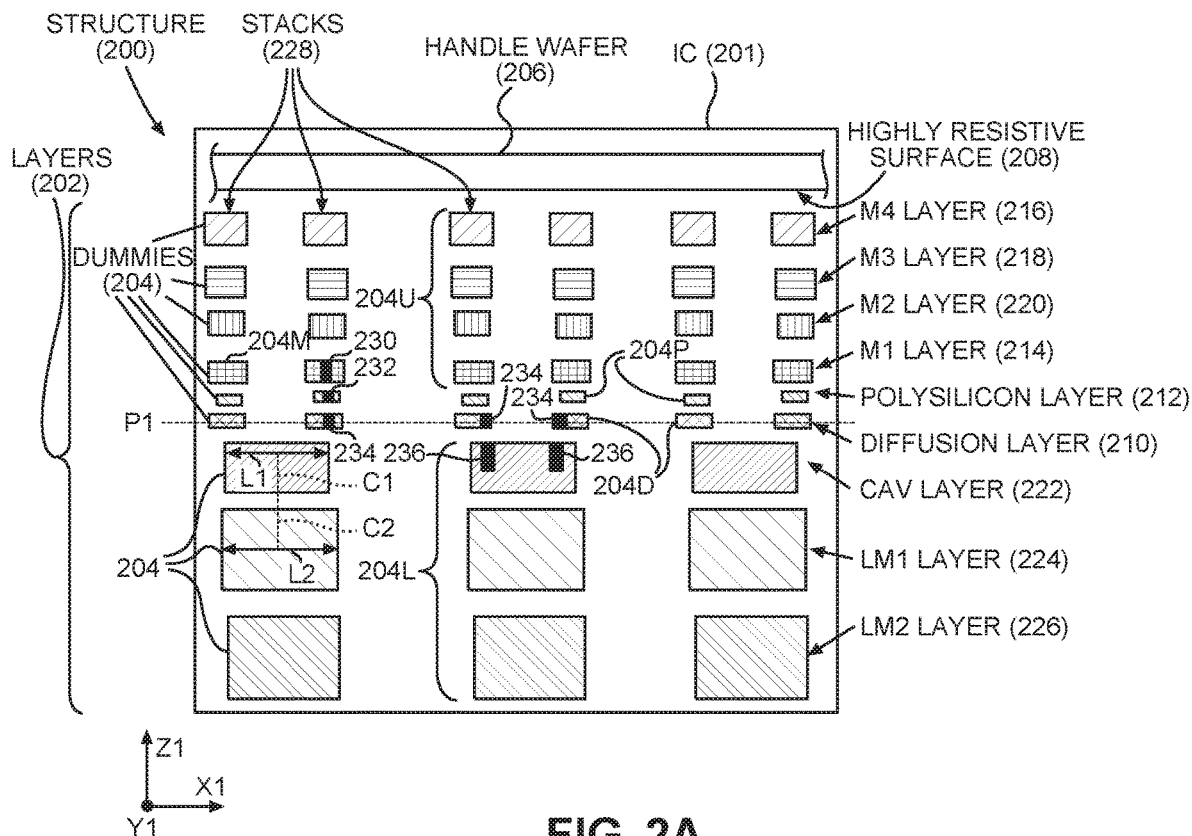
FIG. 2A is a cross-sectional side view of the semiconductor and metal IC layers in FIG. 1A, and including a handle wafer, in an example of custom-placed vertically-aligned dummies for reduced lateral coupling capacitance.

FIG. 2A illustrates a cross-sectional side view of a structure 200 of an IC 201 including layers 202 with vertically-aligned and conductive dummies 204 having significantly-reduced parasitic coupling capacitance and bias dependence compared to the test structure 100 in FIG. 1B. Dummies 204 are islands or isolated regions of the materials provided in the respective layers 202 to reduce polishing non-uniformities (e.g., dishing) in areas that do not include circuit features. For example, the polysilicon dummies 204P are polysilicon islands or isolated regions of polycrystalline silicon and the diffusion dummies 204D are semiconductor islands of semiconductor material. The structure 200 includes a handle wafer 206 including a highly-resistive surface 208 attached to the IC 201. Among the layers 202 discussed herein, adjacent ones of the layers 202 may be in direct contact with each other, which means there are no intervening layers (not shown), or in indirect contact with each other, which means there are one or more intervening layers. The intervening layers may include one or more insulating layers and/or dielectric layers.

The IC 201 includes a diffusion layer 210 in a horizontal plane P1 that extends in a first direction parallel to the axis X1 and a second direction parallel to the axis Y1 in FIG. 2A. The diffusion layer 210 includes a plurality of diffusion dummies 204D that extend in the horizontal plane P1. The IC 201 includes a polysilicon layer 212 that is disposed above the diffusion layer 210 in a vertical direction (orthogonal to the plane P1) parallel to the axis Z. The polysilicon layer 212 includes a plurality of polysilicon dummies 204P. The polysilicon dummies 204P and the diffusion dummies 204D are highly conductive to prevent bias dependent changes in resistance and capacitance. The layers 202 also include a metal 1 (M1) layer 214 that is disposed above the polysilicon layer 212 in the vertical direction. The M1 layer 214 includes a plurality of metal 1 (M1) dummies 204M. The diffusion layer 210 and the polysilicon layer 212 include channel regions and gate regions, respectively, of MOSFETs (not shown) for forming active circuits. The M1 layer 214 in the IC 201 includes metal lines for providing connections between the MOSFETs formed in the diffusion and polysilicon layers 210 and 212.

The dummies 204D, 204P, and 204M are included among the dummies 204. The M1 dummies 204M, the polysilicon dummies 204P, and the diffusion dummies 204D are vertically aligned in stacks to reduce lateral coupling capacitance, to improve signal delay and power consumption in active circuits that include the MOSFETs. Stacks of the vertically-aligned dummies 204D, 204P, and 204M are separated as much as possible without allowing dishing. Customizing placement of dummies 204 in this manner maximizes the diagonal distances corresponding to distances D2-D5 in FIG. 1B, to minimize diagonal coupling and horizontal coupling between dummies 204 in respective layers 202.

With continuing reference to the example in FIG. 2A, the IC 201 includes a semi-insulating handle wafer 206 attached above an M4 layer 216. The handle wafer 206 is also referred to herein as a handle substrate 206. Below the M4 layer 216 in the vertical direction, the IC 201 includes, in order, an M3 layer 218, an M2 layer 220, the M1 layer 214, the polysilicon layer 212, and the diffusion layer 210. Below the diffusion layer 210, the IC 201 includes a cavity (CAV) layer 222, an LM1 layer 224, and an LM2 layer 226. The M4 layer 216, the M3 layer 218, the M2 layer 220, and the M1 layer 214 are above the polysilicon layer 212 in the vertical direction, and the dummies 204 therein are referred to as upper metal dummies 204U. The CAV layer 222, the LM1 layer 224, and the LM2 layer 226 are below the diffusion layer 210, and the dummies 204 therein are referred to as lower metal dummies 204L.

In the example of the IC 201, the dummies 204D, 204P, and 204M are vertically aligned in stacks 228 such that, in each of the stacks 228, a first portion 230 of a metal dummy 204M is above a first portion 232 of a polysilicon dummy 204P in the vertical direction, and a first portion 234 of a diffusion dummy 204D is below the first portion 232 of the polysilicon dummy 204P. In another example, the upper metal dummies 204U are vertically aligned above the polysilicon dummies 204P. In another example, the lower metal dummies 204L are vertically aligned below the diffusion dummies 204D. In one example, vertical alignment refers to an orientation of a first dummy 204 above a second dummy 204 of adjacent horizontal layers 202 in a vertical direction. In another example of vertical alignment, each dummy 204 has a length in a horizontal direction (e.g., X1-axis direction), and an upper dummy 204 is vertically aligned over a lower dummy 204 when a center C1 of a length L1 of the upper dummy 204 is above a center C2 of a length L2 of the lower dummy 204 in the vertical direction. An upper dummy 204 that is vertically aligned above a lower dummy 204 in both the X1-axis direction and the Y1-axis direction is centered over the lower dummy 204.

The polysilicon dummies 204P and the upper metal dummies 204U are vertically aligned in the stacks 228 above the diffusion dummies 204D. The lower metal dummies 204L in the CAV layer 222, the LM1 layer 224, and the LM2 layer 226 are vertically aligned below the diffusion dummies 204D. The lower metal dummies 204L have larger lengths in the horizontal direction (X1) than the diffusion dummies 204D, the polysilicon dummies 204P, and the upper metal dummies 204U. Thus, there may be two stacks 228 above one of the lower metal dummies 204L. In other words, in the example in FIG. 2A, a first portion 234 of a first diffusion dummy 204D is above a first portion 236 of a lower metal dummy 204L, and a first portion 234 of a second diffusion dummy 204D is above a second portion 236 of the lower metal dummy 204L. In FIG. 2A, the dummies 204 are vertically aligned from the LM2 layer 226 to the M4 layer 216 to reduce coupling capacitance.

Figure 2B:
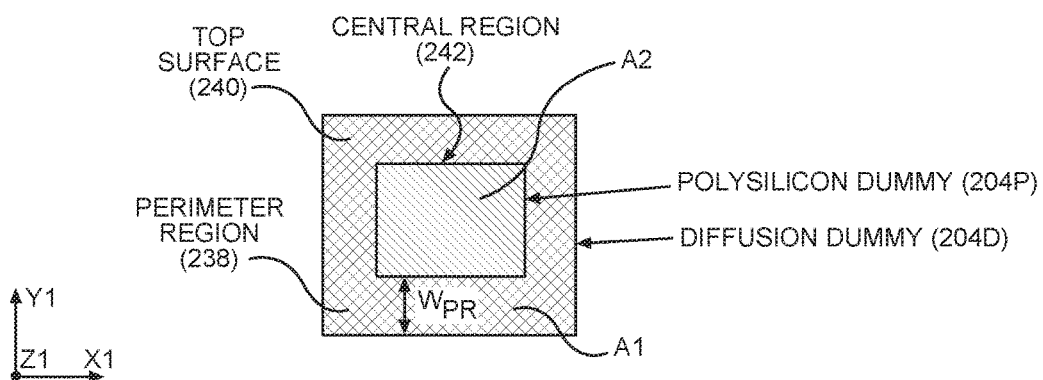
FIG. 2B is a top view of a polysilicon dummy vertically aligned over a diffusion dummy in the semiconductor layers of the IC illustrated in FIG. 2A.

FIG. 2B is a top view of a polysilicon dummy 204P vertically-aligned above a diffusion dummy 204D. An area A1 of the diffusion dummy 204D is larger than an area A2 of the polysilicon dummy 204P, so a perimeter region 238 of the diffusion dummy 204D extends farther in the direction of the X1 axis and in the direction of the Y1 axis than the polysilicon dummy 204P. In the top view in FIG. 2B, a top surface of the diffusion dummy 204D is exposed in the perimeter region 238 around the polysilicon dummy 204P. Below the polysilicon dummy 204P, the diffusion dummy 204D includes a central region 242. In the example in FIG. 2B, the polysilicon dummy 204P is centered over the diffusion dummy 204D. In another example, a portion of the polysilicon dummy 204P is above a portion of the central region 242.

The perimeter region 238 extends around the central region 242. In an example, the perimeter region 238 extends from a first side of the central region 242 to an opposite side of the central region 242. In an example, a portion of the central region 242 is directly between a portion of the perimeter region 238 on the first side of the central region 242 and a portion of the central region 238 on the opposite side of the central region 242. In an example, the perimeter region 238 extends continuously (i.e., without interruption) around a perimeter of the diffusion dummy 204D. In another example, the perimeter region extends around the entire perimeter of the diffusion dummy 204D. The perimeter region 238 has a width $W_{PR}$ extending in a horizontal direction. The width $W_{PR}$ of the perimeter region 238 is a technology-dependent parameter that is sufficient to reliably create an uninterrupted, highly-conductive periphery region around the central region 242, completely enclosing the central region 242 on all sides of the diffusion dummy 204D.

As a result of treatments described below, the polysilicon dummy 204P and the perimeter region 238 are highly conductive and, as such, are not subject to changes in resistance and capacitance in the presence of an electric field. The central region 242 of the diffusion dummy 204D has a first resistivity, and the perimeter region 238 has a second resistivity. The second resistivity of the perimeter region 238 is less than the first resistivity of the central region 242. In other words, the perimeter region 238 is more conductive than the central region 242. Thus, due to the highly-conductive dummies 204P and the highly-conductive perimeter region 238 extending around a perimeter of the diffusion dummies 204D, the polysilicon dummies 204P and the diffusion dummies 204D do not contribute to bias dependence and non-linear operation in active circuits in the IC 201.

As noted above, the diffusion dummies 204D and the polysilicon dummies 204P are treated to be highly conductive to reduce bias dependence to improve linearity of active circuits, which is especially important in RF applications. In one exemplary aspect, in a dopant treatment from above, a dopant of N-type material or P-type material is applied to the polysilicon dummy 204P and also to the perimeter region 238 around a perimeter of the diffusion dummy 204D. A dopant concentration in the central region 242, which is not exposed to the applied dopant, is not increased. Thus, the central region 242 remains at a higher resistivity than the perimeter region 238. In one example, an area of the central region 242 is determined by the area A2 of the polysilicon dummy 204P.

N-type doping materials are pentavalent materials such as phosphorous (P), arsenic (As), and antimony (Sb). P-type doping materials are trivalent materials such as boron (B), gallium (Ga), and indium (In). By applying a high dopant concentration over the entire area A2 of the polysilicon dummy 204P and in the perimeter region 238 of the diffusion dummy 204D, the conductivities of the diffusion dummy 204D and the polysilicon dummy 204P may be increased. Highly-conductive dummies are not subject to changes in resistance and capacitance in the presence of a changing electric field. In this manner, the bias dependence of the diffusion dummies 204D and the polysilicon dummies 204P normally occurring in dummy layouts formed in a foundry process is avoided.

In another exemplary aspect, a process or treatment for increasing conductivity of the diffusion dummies 204D and the polysilicon dummies 204P includes application of a silicide through self-aligned silicidation (i.e., salicidation), which involves the reaction of a metal thin film with a silicon surface, forming a metal layer (e.g., titanium salicide) through a series of annealing and etch processes. Salicidation can be used to create a highly-conductive layer on the dummies 204 in both the polysilicon layer 212 and the diffusion layer 210 in a single process or in separate processes. Due to the perimeter region 238 around the perimeter of the diffusion dummy 204D exposed in horizontal directions outside the polysilicon dummies 204P, the salicide can be applied to the polysilicon dummy 204P and also to the perimeter region 238 of the diffusion dummy 204D in a single process. Alternatively, the salicide can be applied to the diffusion dummies 204D before formation of the polysilicon layer 212, and then applied to the polysilicon dummies 204P. The salicidation process alone may be sufficient to make the polysilicon dummies 204P and the diffusion dummies 204D highly conductive and avoid bias dependence. In another example, the salicidation process may be applied to the polysilicon dummies 204P and the diffusion dummies 204D in addition to the treatment for increasing their respective dopant concentrations to ensure a high level of conductivity.

Figure 3:
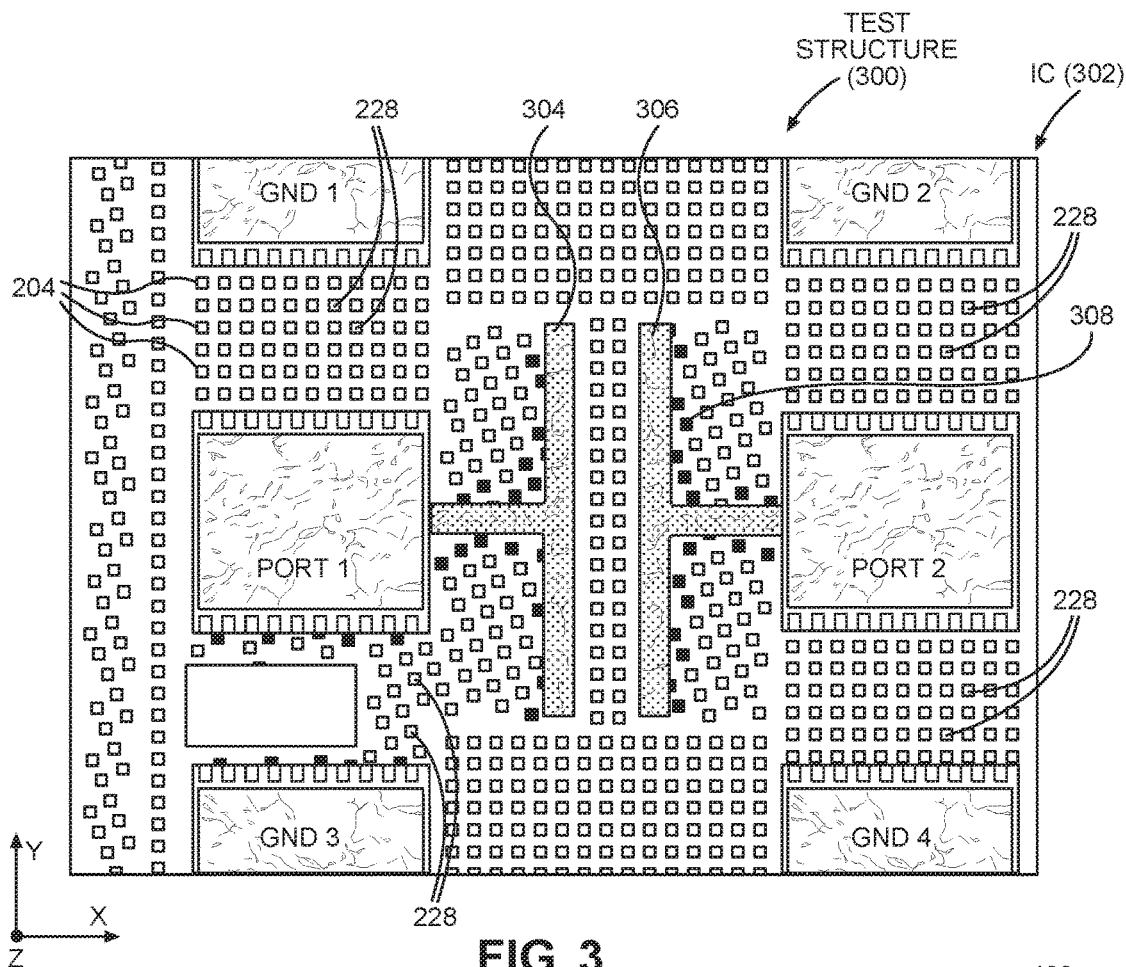
FIG. 3 is a view of a surface of a test structure, illustrating LM2 dummies placed in vertical alignment over LM1 dummies and dummies in the other IC layers for reduced lateral parasitic coupling capacitance.

FIG. 3 is a schematic diagram of a top view of a test structure 300 in an IC 302 including the layers 202 and employing the vertically-aligned dummies 204 as shown in FIGS. 2A and 2B. The test structure 300 includes sensor lines 304, 306 coupled to signal pads Port 1 and Port 2 as in the test structure 100 in FIG. 1. The test structure 300 also includes ground pads GND1-GND4. The dummies 204 are located in vertical stacks 228 according to a custom layout between the signal pads Port 1 and Port 2 and the ground pads GND1-GND4 to avoid parasitic coupling capacitance that would otherwise be created by dummies 204 dispersed in a foundry layout. Vertically-aligned dummies 204 are also located between the sensor lines 304 and 306. Non-overlapping dummies are allowed to be placed by the foundry tool in areas between the sensor line 304 and the signal pad Port 1, and also between the sensor line 306 and the signal pad Port 2, where no capacitive coupling exists between electrically-connected features. Dummies 308 in FIG. 3 indicate spaces in which no lower metal dummy 204L in the LM2 layer 226 could fit, exposing the lower metal dummy 204L in the LM1 layer 224. The vertically-aligned dummies 204 in FIG. 3 significantly reduce parasitic coupling capacitance between the sensor lines 304 and 306, and also between the signal pads Port 1 and Port 2 and the ground pads GND1-GND4 compared to the test structure 100 in FIG. 1A, which includes non-overlapping dummies and bias dependent semiconductor dummies.

Figure 4:
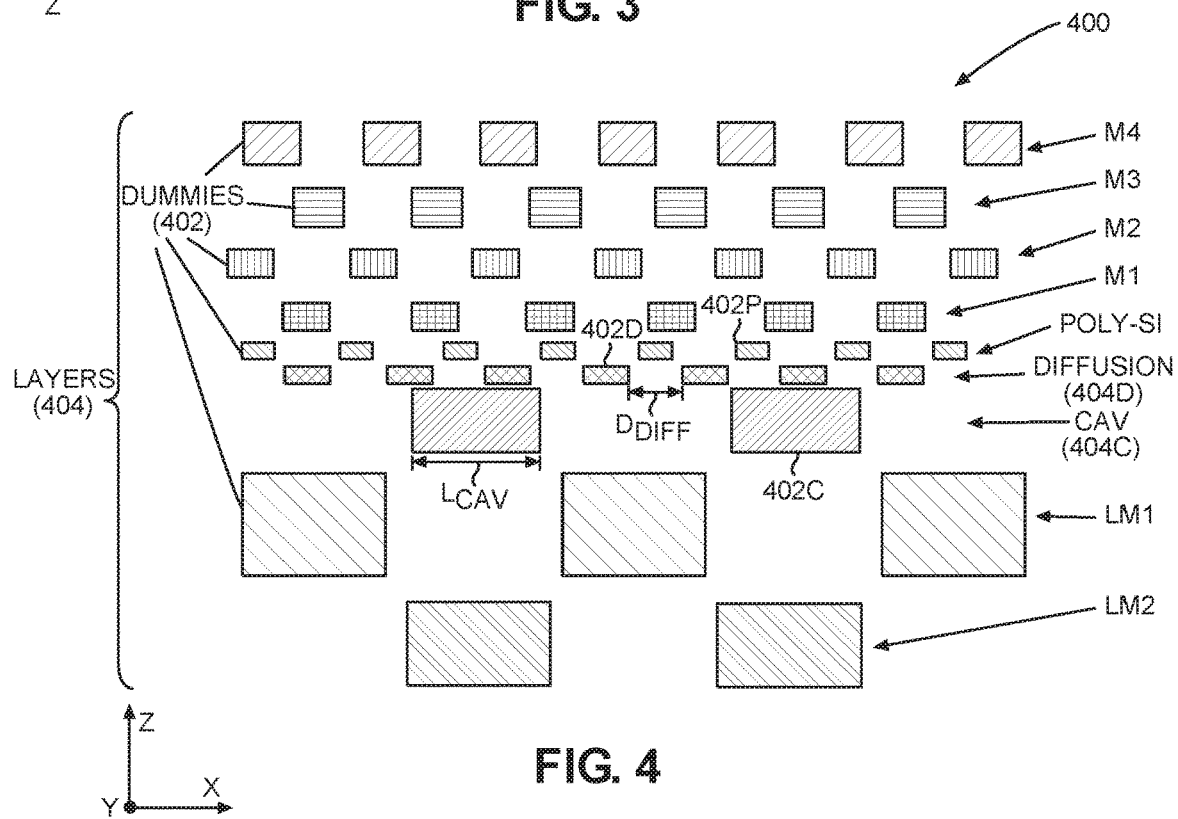
FIG. 4 is a cross-sectional side view of the semiconductor and metal IC layers in FIG. 2A, in an example of non-overlapping dummies as placed by a foundry layout tool that create lateral parasitic coupling capacitance.

In contrast to the exemplary aspects disclosed in FIGS. 2A and 2B, FIG. 4 is an illustration of a structure 400 in which placement of dummies 402 is consistent with the test structure 100 in the IC 102 in FIG. 1A and FIG. 1B. Layers 404 in the structure 400 include the dummies 402 dispersed in a non-overlapping manner according to a foundry layout. Alignment between dummies 402D in a diffusion layer 404D and an adjacent dummy 402C in a CAV layer 404C of the layers 404 is merely incidental due to a length $L_{CAV}$ of the dummy 402C being greater than a horizontal separation distance $D_{DIFF}$ between the diffusion dummies 402D to avoid dishing. Dummies 402 placed in a non-overlapping arrangement as shown in FIG. 4 correspond to the layers 122 of the test structure 100 in FIG. 1B, which cause parasitic capacitance that increases signal delays and power consumption in active circuits. Overlap of dummies 402 is actually avoided by the foundry layout tools due to concerns about vertical coupling capacitance that can develop to some handle substrates. In addition, the foundry process for generating dummies prevents the diffusion dummies 402D and polysilicon dummies 402P from becoming highly conductive, because such conductivity increases vertical coupling capacitance. Thus, layout of the structure 400 as shown in FIG. 4 creates problems that are overcome by the exemplary vertically-aligned and conductive dummies 204 in FIGS. 2A, 2B, and 3.

Figure 5:
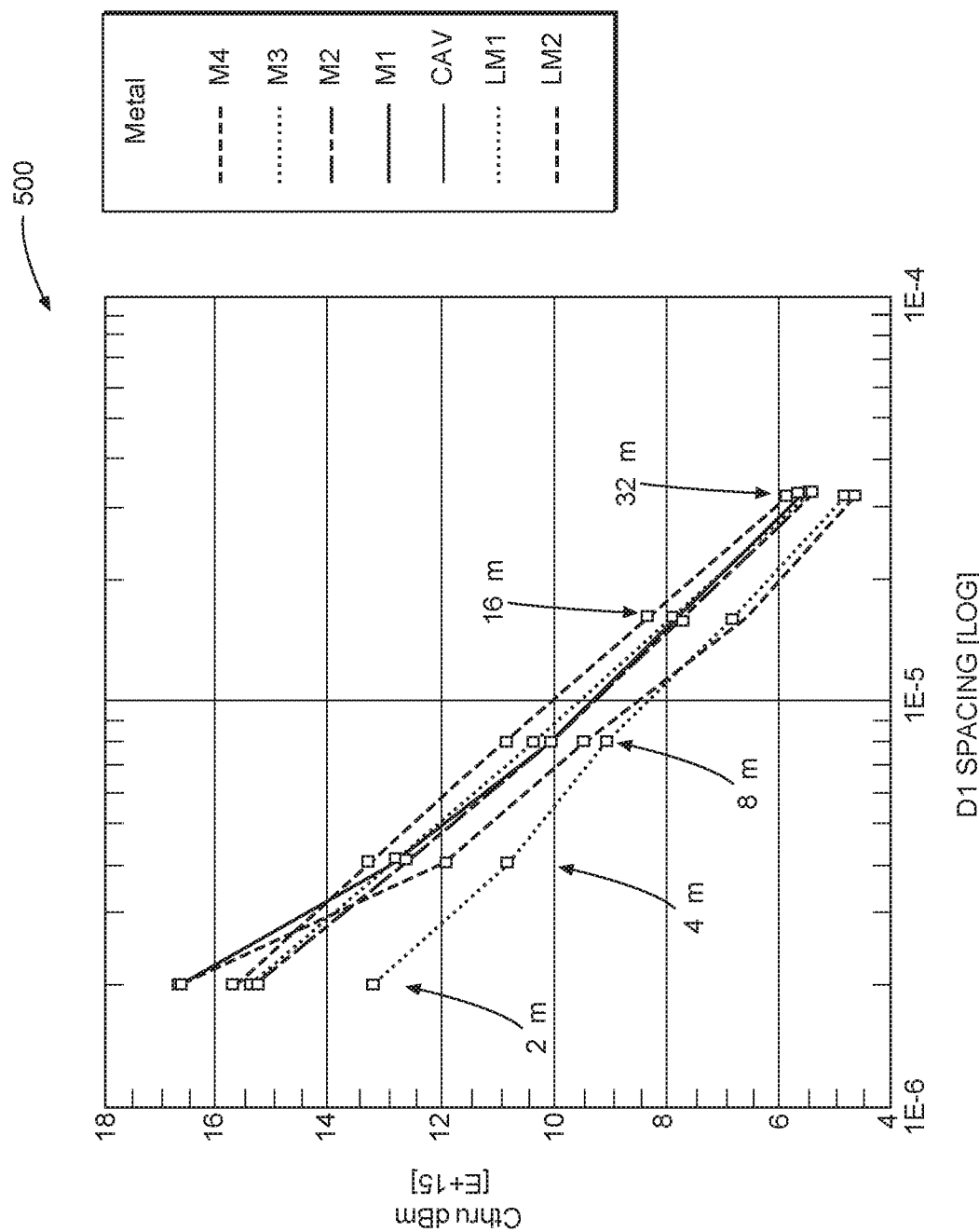
FIG. 5 is a graphical illustration of measurements of capacitance between sensor lines in a test structure as illustrated in FIG. 3 with dummies custom placed in vertical alignment in each of the semiconductor and metal layers.

FIG. 5 is a graphical illustration 500 of measurements of parasitic coupling capacitances Cthru (between signal pad Port 1 and signal pad Port 2) in a first set of test structures similar to the test structures 200 and 300 in FIGS. 2A, 2B, and 3 with the layers 202 including vertically-aligned dummies 204. The test structures were identical to each other except with respect to two variables. The first variable was the distance D1 between sensor lines (e.g., sensor lines 304 and 306). The second variable was the metal level at which the sensor lines were placed. In this regard, test structures were generated with sensor lines at one of six (6) metal levels (M4, M3, M2, M1, LM1, and LM2). For each metal level, a test structure was generated with each of distances D1 between the sensor lines of 2 microns (μm), 4 μm, 8 μm, 16 μm, and 32 μm. Thus, thirty (30) measurements of Cthru are presented in FIG. 5, one for each distance D1 and for each of the 6 metal levels.

Figure 6:
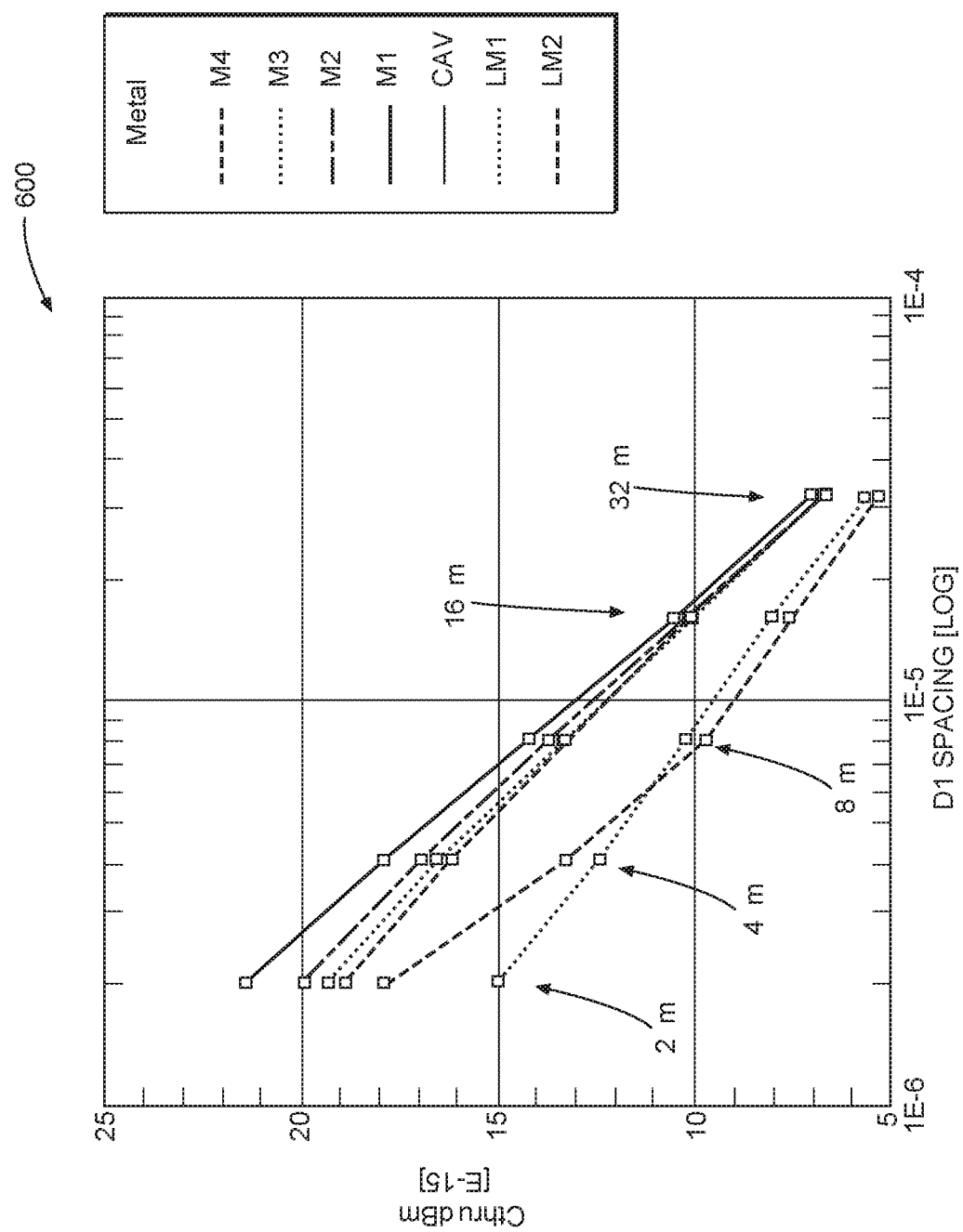
FIG. 6 is a graphical illustration of measurements of capacitance between sensor lines in a test structure as illustrated in FIG. 1A with non-overlapping semiconductor and metal dummies as dispersed by a foundry layout tool.

FIG. 6 is a graphical illustration 600 of measurements of parasitic coupling capacitances Cthru of a second set of the test structures similar to the test structures 100 and 400 in FIGS. 1A, 1B, and 4. The second set of test structures was identical to the first set of test structures but included non-overlapping dummies as dispersed in a factory layout.

FIGS. 5 and 6 are provided for comparison purposes to illustrate the difference in total parasitic coupling capacitance achieved by the exemplary aspects disclosed herein including vertically-aligned dummies 204 and conductive dummies 204P and 204D. A comparison of the data in FIGS. 5 and 6 shows a significant difference in the magnitude of parasitic coupling capacitance Cthru, with measurements in the test structure 300 being significantly lower than in the test structure 100 at all metal levels. This comparison confirms the determination that the non-overlapping dummies as dispersed in a foundry layout were a significant source of lateral parasitic coupling capacitance, and that such parasitic coupling capacitance is avoided by vertically aligning the dummies.

Figure 7:
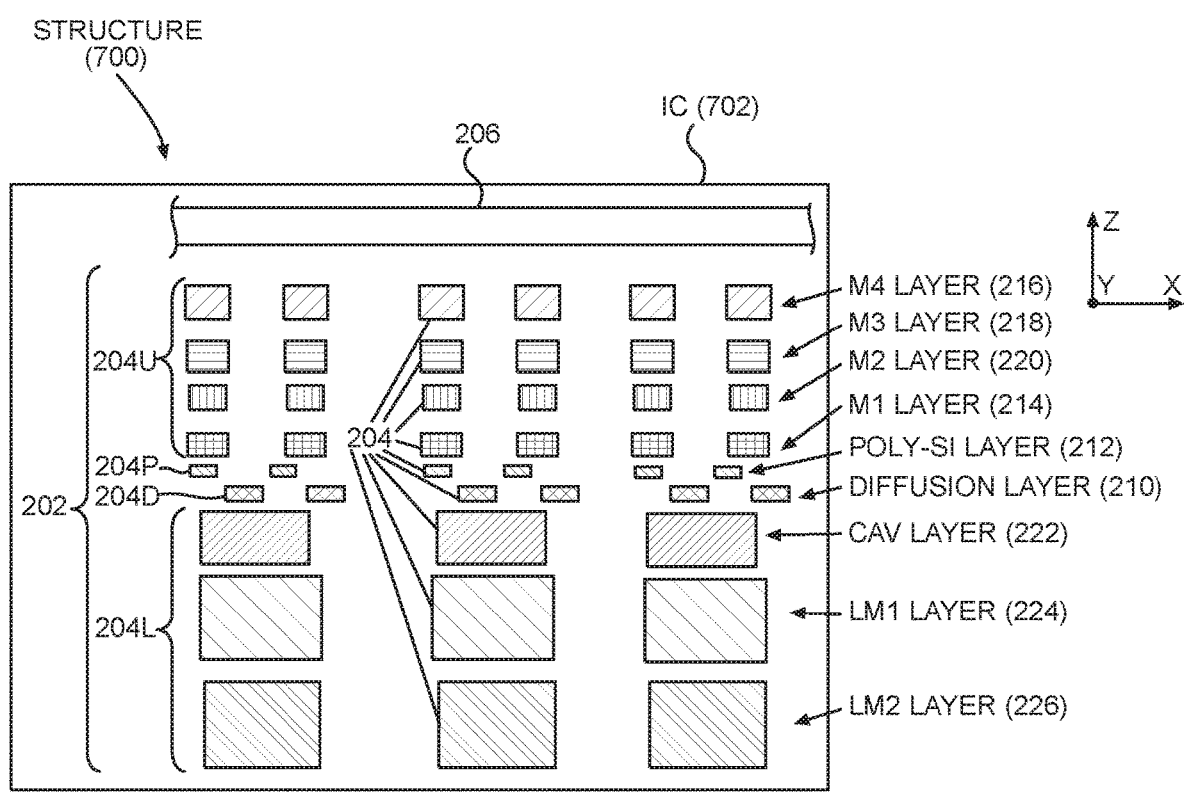
FIG. 7 is a cross-sectional side view of the semiconductor and metal IC layers in FIG. 3, in an example of custom-placed vertically-aligned metal dummies and non-overlapping diffusion and polysilicon dummies.

FIG. 7 is a cross-sectional side view of a structure 700 of an IC 702 in another embodiment of the first exemplary aspect of vertically-aligned dummies similar to the test structure 200 in FIG. 2A. Reference numbers of elements in FIG. 7 correspond to the reference numbers of like elements in FIG. 2A. In FIG. 7, the upper metal dummies 204U are vertically aligned with dummies 204P in the polysilicon layer 212, and the lower metal dummies 204L are vertically aligned with dummies 204D in the diffusion layer 210. In addition, the upper metal dummies 204U may be aligned with the lower metal dummies 204L. However, the polysilicon dummies 204P and the diffusion dummies 204D are not vertically aligned with each other. As a result, some unwanted parasitic coupling capacitance would exist between the diagonally-disposed polysilicon dummies 204P and the diffusion dummies 204D. Thus, the parasitic coupling capacitance is lower in the embodiment shown in FIG. 2A than the embodiment in FIG. 7. However, despite this difference, the parasitic coupling capacitance in the structure 700 is significantly reduced compared to the test structure 100 due to vertical alignment of the upper metal dummies 204U and the lower metal dummies 204L.

Reasons for intentional misalignment of the polysilicon dummies 204P and the diffusion dummies 204D may be that separate processes are employed for treating the diffusion dummies 204D before the polysilicon layer 212 is formed.

Figure 8:
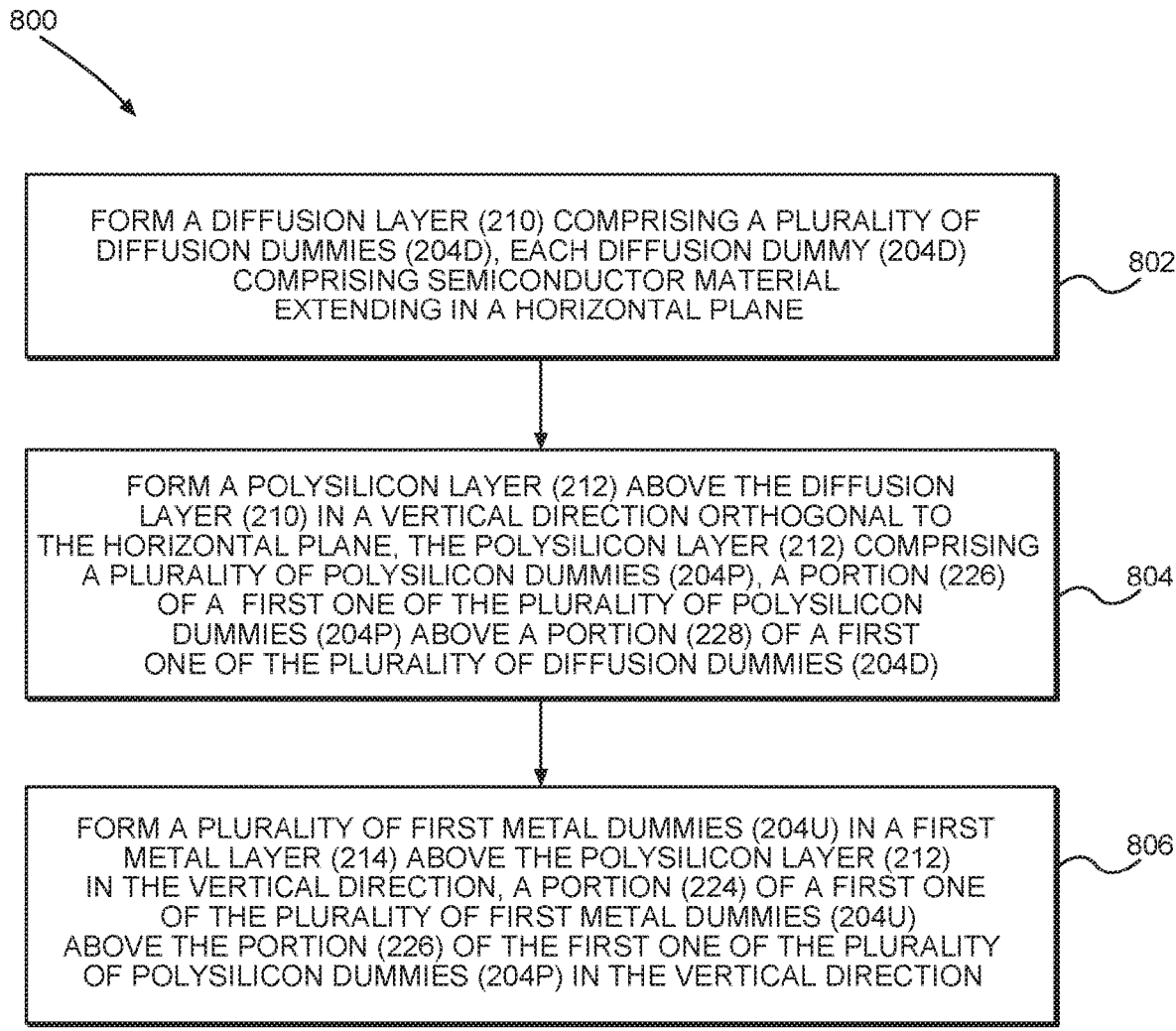
FIG. 8 is a flowchart illustrating a first method of manufacturing an IC on a handle substrate including vertically-aligned dummies.

In another aspect disclosed herein, a method 800 of manufacturing an IC is illustrated in the flowchart in FIG. 8. The method 800 includes forming a diffusion layer 210 comprising a plurality of diffusion dummies 204D, each diffusion dummy 204D comprising semiconductor material extending in a horizontal plane (block 802). The method 800 also includes forming a polysilicon layer 212 above the diffusion layer 210 in a vertical direction orthogonal to the horizontal plane, the polysilicon layer 212 comprising a plurality of polysilicon dummies 204P, a portion 226 of a first one of the plurality of polysilicon dummies 204P above a portion 228 of a first one of the plurality of diffusion dummies 204D (block 804). The method 800 also includes forming a plurality of first metal dummies 204U in a first metal layer 214 above the polysilicon layer 212 in the vertical direction, a portion 224 of a first one of the plurality of first metal dummies 204U above the portion 226 of the first one of the plurality of polysilicon dummies 204P in the vertical direction (block 806).

Figure 9:
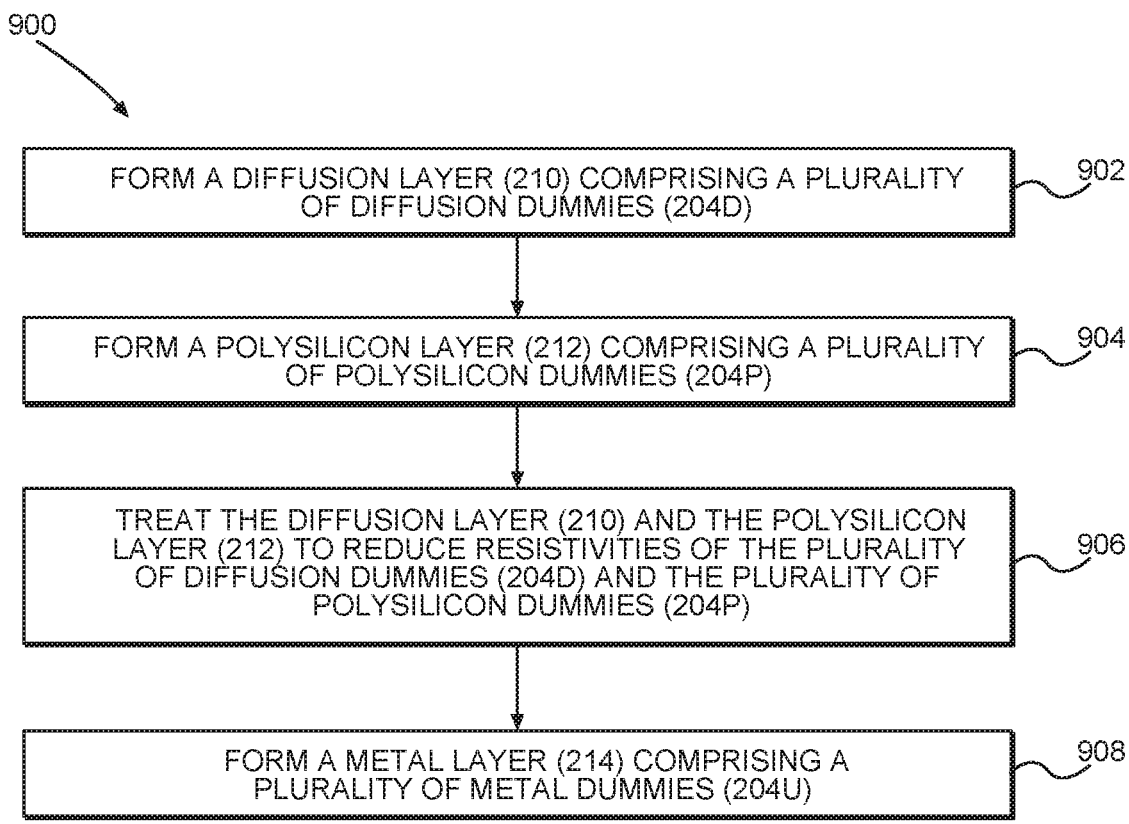
FIG. 9 is a flowchart illustrating a second method of manufacturing an IC on a handle substrate including conductive semiconductor dummies.

In another aspect disclosed herein, a method 900 of manufacturing an IC is illustrated in the flowchart in FIG. 9. The method 900 includes forming a diffusion layer 210 comprising a plurality of diffusion dummies 204D (block 902), forming a polysilicon layer 212 comprising a plurality of polysilicon dummies 204P (block 904), treating the diffusion layer 210 and the polysilicon layer 212 to reduce resistivity of each of the plurality of diffusion dummies 204D and each of the plurality of polysilicon dummies 204P (block 906), and forming a metal layer 214 comprising a plurality of metal dummies 204U (block 908).

Vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
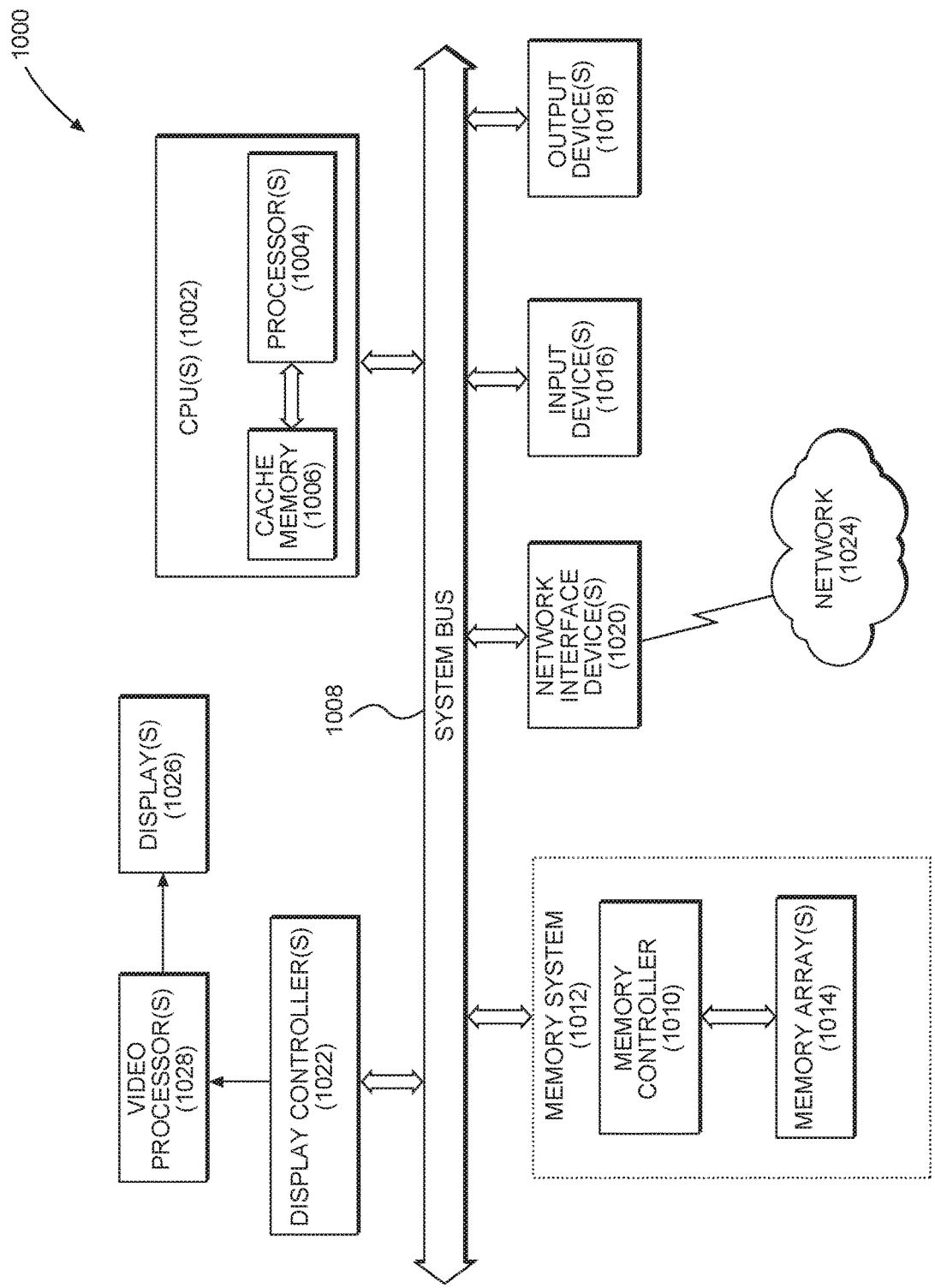
FIG. 10 is a block diagram of an exemplary processor-based system that can include an IC including vertically-aligned and conductive dummies including, but not limited to, the dummies in FIGS. 2A, 2B, 3, and 7.

In this regard, FIG. 10 illustrates an example of a processor-based system 1000 including vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein. In this example, the processor-based system 1000 includes one or more central processor units (CPUs) 1002, which may also be referred to as CPU or processor cores, each including one or more processors 1004. The CPU(s) 1002 may have cache memory 1006 coupled to the processor(s) 1004 for rapid access to temporarily stored data. As an example, the processor(s) 1004 could include vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012 that includes the memory controller 1010 and one or more memory arrays 1014, one or more input devices 1016, one or more output devices 1018, one or more network interface devices 1020, and one or more display controllers 1022, as examples. Each of the memory system 1012, the one or more input devices 1016, the one or more output devices 1018, the one or more network interface devices 1020, and the one or more display controllers 1022 can include vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein. The input device(s) 1016 can include any type of input device, including, but not limited to, input keys, switches, voice processors, etc. The output device(s) 1018 can include any type of output device, including, but not limited to, audio, video, other visual indicators, etc. The network interface device(s) 1020 can be any device configured to allow exchange of data to and from a network 1024. The network 1024 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1020 can be configured to support any type of communications protocol desired.

The CPU(s) 1002 may also be configured to access the display controller(s) 1022 over the system bus 1008 to control information sent to one or more displays 1026. The display controller(s) 1022 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc. The display controller(s) 1022, display(s) 1026, and/or the video processor(s) 1028 can include vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein.

Figure 11:
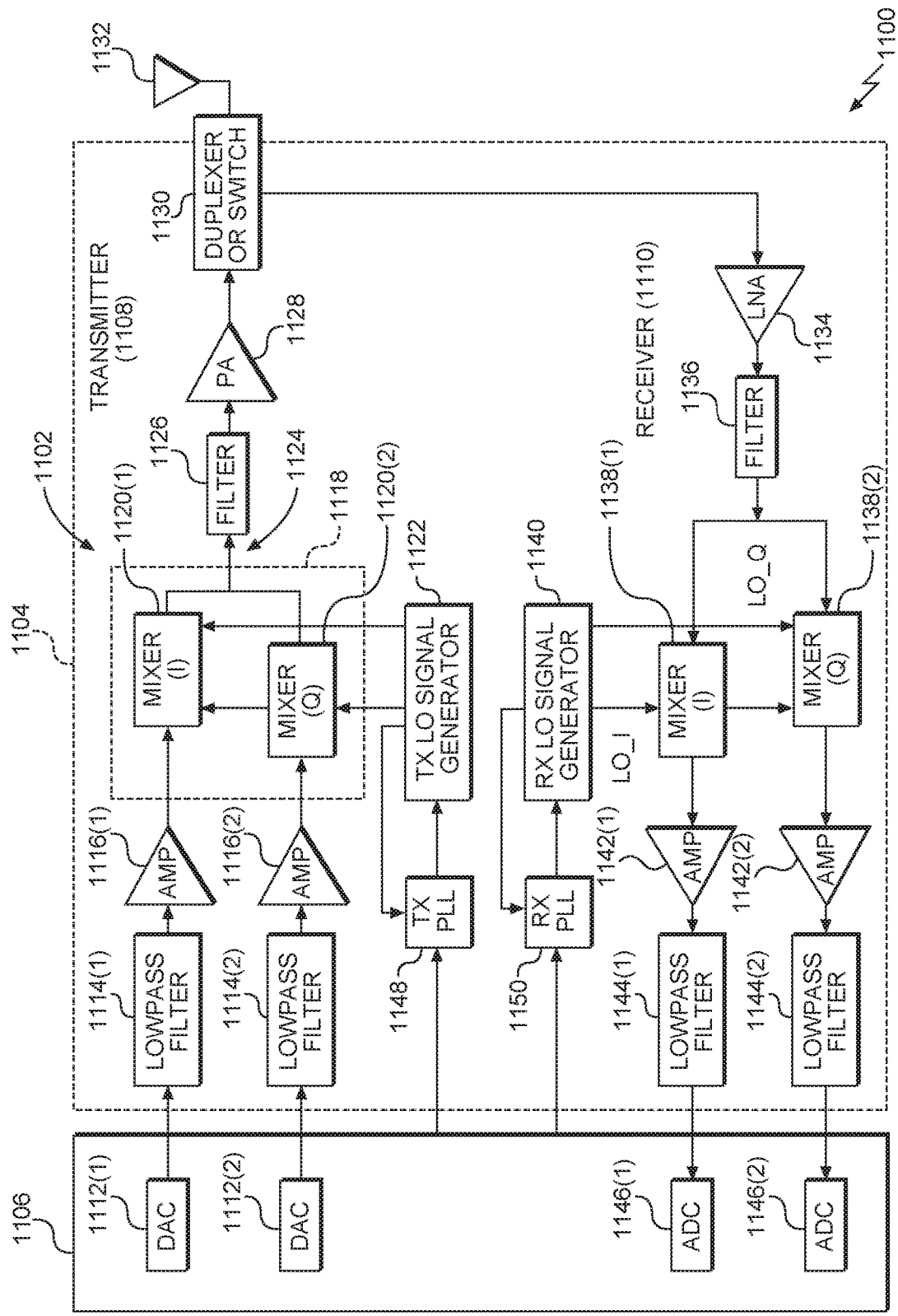
FIG. 11 is a block diagram of an exemplary wireless communications device that includes radio frequency (RF) components formed from an IC, wherein the IC can include vertically-aligned and conductive dummies including, but not limited to, the dummies in FIGS. 2A, 2B, 3, and 7.

FIG. 11 illustrates an exemplary wireless communications device 1100 that includes RF components formed from an IC 1102, wherein any of the components therein can include vertically-aligned dummies in an IC including highly-conductive semiconductor (polysilicon and diffusion) layer dummies to reduce lateral parasitic coupling capacitance and bias dependence, as illustrated in any of FIGS. 2A, 2B, 3, and 7, and according to any aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmitted RF signal. The transmitted RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analogto-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
a plurality of diffusion dummies in a diffusion layer, each diffusion dummy comprising semiconductor material extending in a horizontal plane;
a plurality of polysilicon dummies in a polysilicon layer above the diffusion layer in a vertical direction orthogonal to the horizontal plane; and
a plurality of metal dummies in a metal layer above the polysilicon layer in the vertical direction,
wherein:
a first portion of a first metal dummy of the plurality of metal dummies is above a first portion of a first polysilicon dummy of the plurality of polysilicon dummies in the vertical direction; and
a first portion of a first diffusion dummy of the plurality of diffusion dummies is below the first portion of the first polysilicon dummy in the vertical direction.

2. The IC of claim 1, wherein:
the first diffusion dummy of the plurality of diffusion dummies extends a first length in a first horizontal direction;
the first polysilicon dummy of the plurality of polysilicon dummies extends a second length in the first horizontal direction;
the first metal dummy of the plurality of metal dummies extends a third length in the first horizontal direction;
a center of the first length is directly above a center of the second length; and
a center of the third length is directly below the center of the second length.

3. The IC of claim 1, wherein:
each of the plurality of polysilicon dummies comprises polycrystalline silicon; and each of the plurality of metal dummies comprises a conductive metal.

4. The IC of claim 1, wherein:
the IC further comprises a plurality of upper metal layers above the metal layer in the vertical direction, each of the plurality of upper metal layers comprising a plurality of upper metal dummies; and
a portion of one of the plurality of upper metal dummies in each of the plurality of upper metal layers is above the first portion of the first metal dummy in the vertical direction.

5. The IC of claim 1, wherein:
a first portion of a second metal dummy of the plurality of metal dummies is above a first portion of a second polysilicon dummy in the vertical direction; and
a first portion of a second diffusion dummy of the plurality of diffusion dummies is below the first portion of the second polysilicon dummy in the vertical direction.

6. The IC of claim 1, wherein:
the IC further comprises a lower metal layer below the diffusion layer in the vertical direction, the lower metal layer comprising a plurality of lower metal dummies; and
a first portion of a first lower metal dummy of the plurality of lower metal dummies is below the first portion of the first diffusion dummy in the vertical direction.

7. The IC of claim 6, wherein:
a first portion of a second diffusion dummy of the plurality of diffusion dummies is above a second portion of the first lower metal dummy in the vertical direction;
a first portion of a second polysilicon dummy of the plurality of polysilicon dummies is above the first portion of the second diffusion dummy in the vertical direction; and
a first portion of a second metal dummy of the plurality of metal dummies is above the first portion of the second polysilicon dummy in the vertical direction.

8. The IC of claim 1, further comprising a plurality of silicon-on-insulator (SOI) metal-oxide-semiconductor (MOS) transistors each comprising a channel region in the diffusion layer, a gate region in the polysilicon layer, a source contact in the metal layer, and a drain contact in the metal layer.

9. The IC of claim 1, wherein the diffusion layer comprises silicon doped with at least one of a P-type dopant and an N-type dopant.

10. The IC of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A method of manufacturing an integrated circuit (IC), the method comprising:
forming a diffusion layer comprising a plurality of diffusion dummies, each diffusion dummy comprising semiconductor material extending in a horizontal plane;
forming a polysilicon layer above the diffusion layer in a vertical direction orthogonal to the horizontal plane, the polysilicon layer comprising a plurality of polysilicon dummies, a portion of a first one of the plurality of polysilicon dummies above a portion of a first one of the plurality of diffusion dummies in the vertical direction; and
forming a plurality of first metal dummies in a first metal layer above the polysilicon layer in the vertical direction, a portion of a first one of the plurality of first metal dummies above the portion of the first one of the plurality of polysilicon dummies in the vertical direction.

12. The method of claim 11, further comprising:
forming an upper metal layer comprising a plurality of upper metal dummies above the first metal layer in the vertical direction, comprising:
forming a portion of a first one of the plurality of upper metal dummies above the portion of the first one of the plurality of first metal dummies in the vertical direction.

13. The method of claim 11, further comprising:
forming a plurality of lower metal layers below the diffusion layer in the vertical direction, comprising:
forming a portion of one lower metal dummy in each of the plurality of lower metal layers below the portion of the first one of the plurality of diffusion dummies in the vertical direction.

14. The method of claim 11, further comprising:
forming a portion of a second one of the plurality of polysilicon dummies above a portion of a second one of the plurality of diffusion dummies in the vertical direction; and
forming a portion of a second one of the plurality of first metal dummies above the portion of the second one of the plurality of polysilicon dummies in the vertical direction.

15. The method of claim 11, further comprising:
forming a plurality of silicon-on-insulator (SOI) metal-oxide-semiconductor (MOS) transistors comprising:
forming a channel region in the diffusion layer;
forming a gate region in the polysilicon layer; and
forming a source contact and a drain contact in the first metal layer.

16. The method of claim 11, wherein forming the diffusion layer comprises forming a silicon layer doped with at least one of a P-type dopant and an N-type dopant.

17. The method of claim 11, further comprising doping the plurality of diffusion dummies and the plurality of polysilicon dummies with an N-type dopant or a P-type dopant to increase dopant concentrations of the plurality of diffusion dummies and the plurality of polysilicon dummies.

18. The method of claim 11, further comprising treating the plurality of diffusion dummies and the plurality of polysilicon dummies with a salicide process to form a conductive layer.

* * * * *